US006942025B2

(12) United States Patent
Nair et al.

(10) Patent No.: US 6,942,025 B2
(45) Date of Patent: Sep. 13, 2005

(54) UNIFORM HEAT DISSIPATING AND COOLING HEAT SINK

(75) Inventors: Rajesh Nair, Nashua, NH (US); Izundu F. Obinelo, Nashua, NH (US)

(73) Assignee: Degree Controls, Inc., Milford, NH (US)

( * ) Notice: Subject to any disclaimer, the term of this patent is extended or adjusted under 35 U.S.C. 154(b) by 0 days.

(21) Appl. No.: 10/301,286

(22) Filed: Nov. 21, 2002

(65) Prior Publication Data

US 2003/0131973 A1 Jul. 17, 2003

Related U.S. Application Data

(63) Continuation of application No. 09/666,670, filed on Sep. 20, 2000, now abandoned.

(51) Int. Cl.$^{7}$ .................................................. H05K 7/20

(52) U.S. Cl. ..................... 165/185; 165/80.3; 174/16.3; 257/722; 361/704

(58) Field of Search ................................ 165/80.3, 185; 174/16.3; 257/722; 361/704

(56) References Cited

U.S. PATENT DOCUMENTS 3,412,566 A 11/1968 Townsend et al.
3,566,958 A 3/1971 Zelina
3,721,289 A 3/1973 Seal
3,790,859 A * 2/1974 Schraeder et al. ......... 174/16.3
3,947,868 A 3/1976 Nitsche et al.
4,142,662 A 3/1979 Holbrook et al.
4,321,617 A 3/1982 Duda et al.
4,541,004 A * 9/1985 Moore ........................ 257/722
4,645,116 A 2/1987 Henein et al.
4,709,560 A 12/1987 Voorhis et al.
4,823,869 A * 4/1989 Arnold et al. .............. 165/185
4,879,632 A * 11/1989 Yamamoto et al. ......... 165/185
4,899,210 A * 2/1990 Lorenzetti et al. .......... 257/722
4,918,571 A 4/1990 Grabbe
4,953,058 A 8/1990 Harris
4,962,416 A * 10/1990 Jones et al. ................. 257/722
5,079,635 A * 1/1992 Koshiyouji et al. ......... 257/722
5,158,136 A 10/1992 Azar
5,241,453 A * 8/1993 Bright et al. ............... 361/704
5,291,064 A 3/1994 Kurokawa
5,297,025 A 3/1994 Shoquist et al.
5,365,400 A 11/1994 Ashiwake et al.
5,369,301 A 11/1994 Hayashi et al.
5,443,032 A 8/1995 Vichr et al.
5,455,382 A 10/1995 Kojima et al.
5,530,295 A 6/1996 Mehr
5,548,605 A 8/1996 Benett et al.
5,625,229 A 4/1997 Kojima et al.
5,726,495 A 3/1998 Aihara et al.
5,791,045 A 8/1998 Yamamoto et al.
5,828,551 A 10/1998 Hoshino et al.
5,844,313 A 12/1998 Hoffmann
5,930,115 A 7/1999 Tracy et al.
5,986,884 A 11/1999 Jairazbhoy et al.
6,131,646 A 10/2000 Kelley
6,145,586 A 11/2000 Lo
6,295,202 B1 9/2001 Tucker et al.
6,316,826 B1 11/2001 Yamamoto et al.
6,390,181 B1 5/2002 Hall et al.
6,663,294 B2 12/2003 Crane, Jr. et al.
2003/0183368 A1 10/2003 Paradis et al.

FOREIGN PATENT DOCUMENTS

EP 0 538 798 A1 4/1993
JP 05343572 A * 12/1993 ................ 257/722

* cited by examiner

*Primary Examiner*—Leonard R. Leo
(74) *Attorney, Agent, or Firm*—Iandiorio & Teska

(57) ABSTRACT

A uniform heat dissipating and cooling heat sink for increasing conductive cooling at locations where conductive cooling and temperature differential is reduced. The heat sink includes a base having a variable thickness with a maximum thickness at the interior thereof and a plurality of fins upstanding from the base with adjacent fins separated by a flow channel having diverging sides.

4 Claims, 8 Drawing Sheets

UNIFORM HEAT DISSIPATING AND COOLING HEAT SINK

RELATED APPLICATIONS

This application is a continuation of application Ser. No. 09/666,670 filed on Sep. 20, 2000 now abandoned.

FIELD OF THE INVENTION

This invention relates to a heat sink cooling device and particularly to an improved uniform heat dissipating and cooling heat sink.

BACKGROUND OF THE INVENTION

Modern electronic components, such as integrated circuits, processor chips, and power supplies are typically mounted on circuit boards, PC boards, or telecommunication boards and often produce significant quantities of heat which can damage the component itself and/or other adjacent components. Accordingly, heat sinks are used to cool and dissipate heat from such components.

Heat sinks are often attached to the top of the electronic component to remove heat from the component by conduction. For heat transfer by conduction, the predominant factors include the thermal conductive properties of the material of the heat sink, the cross sectional area of the heat sink, and the thickness of the heat sink in the main direction of the heat flow.

For a homogenous material, heat transfer by conduction in any direction is dictated by the relationship:

$$q_x = -kA_x \frac{dT}{dx} \tag{1}$$

where x is the direction of heat flux, k is the thermal conductivity of the heat sink material, $A_x$ is the cross-sectional area perpendicular to the heat transfer direction, and $$\frac{dT}{dx}$$

is the rate of temperature change in the heat transfer direction. For conceptual convenience, consider a one-dimensional heat conduction situation for which Eq. 1 simplifies to $$q_L = kA \frac{\Delta T}{L} \tag{2}$$

where L is the thickness of the material in the main direction of heat flow. This equation shows that the heat transfer rate is directly proportional to the cross-sectional area of the heat sink and inversely proportional to the path traversed by the heat flux.

Heat sinks themselves are cooled by a process known as heat transfer by convection. For this process of heat removal, which relies on a flow of air around the heat sink, the total surface area subject to an air flow is the critical factor.

Typical prior art heat sinks incorporate a body with a constant uniform thickness and therefore a constant uniform cross sectional area. One problem with this design is that the heat sink itself is not cooled uniformly because the edges of the sink have a greater surface area exposed to ambient air than the interior portion, and thus the edges cool more efficiently by convection than the interior portion. Because the heat transfer by conduction is uniform throughout the heat sink because of the constant cross-sectional area of the heat sink, any component attached to the heat sink is cooled more on the outside edges than the interior portion, leading to uneven cooling and heat dissipation of the component. Warping, cracking, or malfunctioning of the electronic component is often the result.

Further, prior art heat sinks are not aerodynamically efficient because the flat square shape of the heat sink body obstructs air flow passing.

Some prior art heat sinks include fins to enhance the convective cooling efficiency. The fins increase the total surface area of the heat sink and therefore increase the overall heat transfer by convection. However, prior art fin designs typically employ upstanding parallel fins with rectangular channels between adjacent fins. Alternatively, some prior art heat sinks use cylindrical "pin-fins". Both of these fin designs, however, have several disadvantages.

For parallel fin designs, the square channel design blocks and obstructs air flow thereby increasing air flow resistance, lowering air flow velocity, and reducing the convective cooling ability of the heat sink.

Also, parallel fin designs with rectangular channels between the adjacent fins is inefficient because each upstanding parallel fin projects radiating air toward all the adjacent fins which partially heats the adjacent fins and reduces the cooling efficiency of the heat sink.

Cylindrical "pin-fin" heat sinks also suffer from the same problem because heat is projected 360° from each cylindrical pin-fin toward all adjacent fins.

In addition, the square or cylindrical pin-fin designs do not provide the maximum surface area to fin density and footprint to maximize convective cooling of the heat sink.

SUMMARY OF THE INVENTION

It is therefore an object of this invention to provide a uniform heat dissipating and cooling heat sink device.

It is a further object of this invention to provide such a uniform heat dissipating and cooling heat sink with variable cooling regions.

It is a further object of this invention to provide such a uniform heat dissipating and cooling heat sink device with an increased total surface area.

It is a further object of this invention to provide such a uniform heat dissipating and cooling heat sink which provides decreased air flow resistance.

It is a further object of this invention to provide such a uniform heat dissipating and cooling heat sink which provides increased air flow velocity over the heat sink.

It is a further object of this invention to provide such a uniform heat dissipating and cooling heat sink which provides decreased air flow turbulence over the heat sink.

It is a further object of this invention to provide such a uniform heat dissipating and cooling heat sink device including fins with diverging sides which direct radiant heat flow away from adjacent fins.

The invention results from the realization that a truly effective and robust uniform heat dissipating and cooling heat sink can be achieved first by providing a variable thickness base wherein the greatest thickness is at the interior of the heat sink to increase conductive cooling in the regions where conductive cooling and the temperature gradient is the lowest thereby providing uniform heat dissipation and cooling to a component affixed to the heat sink;

second by a unique air foil-like shaped base which increases the air flow velocity and reduces air flow turbulence to further improve the convective cooling of the heat sink; and third by providing a number of fins upstanding from the base separated by a flow channel having diverging sides which increases the total surface area of the heat sink, which increases air flow through over the sink, and which projects heat radiation away from adjacent fins to improve convective and radiative cooling.

This invention features a uniform heat dissipating and cooling heat sink including a base having a variable thickness with a maximum thickness at the interior thereof to increase conductive cooling at locations where conductive cooling and the temperature differential is reduced. The base typically also includes a plurality of fins upstanding from the base with adjacent fins separated by a flow channel having diverging sides.

The heat sink in accordance with this invention may include a rectangular base with the maximum thickness is at the center and the thinnest portions of the base are at each edge of the base. The thickness of the center of the base may be at least two times the thickness of the edges of the base.

Each fin is preferably separated from each adjacent fin by a flow channel having with diverging sides forming a plurality of discrete pyramid-shaped fins. Preferably, each fin has a rectangular cross section with a flat rectangular top for increasing the surface area of the fins. The shape of the flow channel may be a V-shaped groove. The sides of the flow channel typically diverge at an angle of between 20°–30°.

This invention also features a heat sink as described above as a component of an electronic assembly.

BRIEF DESCRIPTION OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
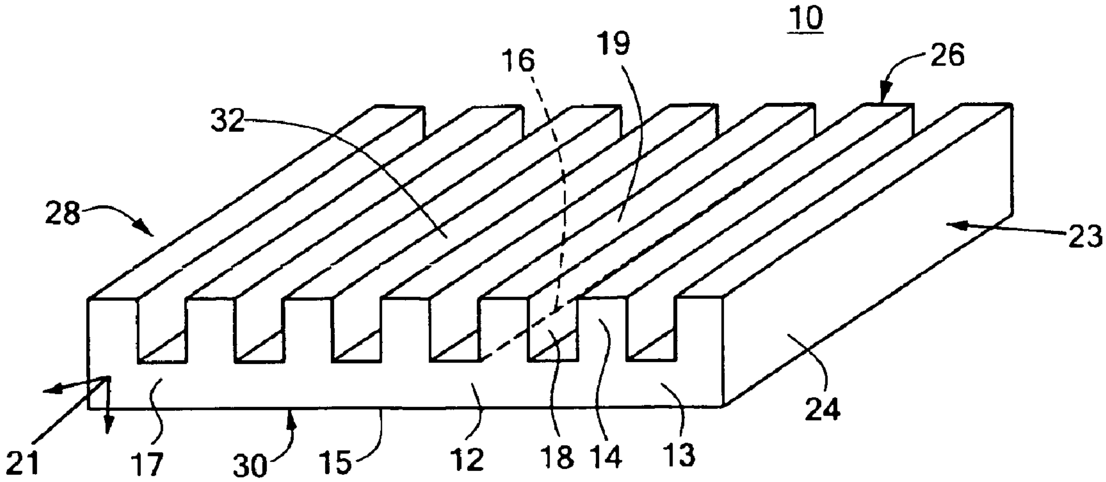
FIG. 1 is a schematic three-dimensional view of a prior art heat sink with square channel fins.

As explained in the Background of the Invention section above, typical prior art heat sink 10 includes uniform thickness body 12, upstanding fin 14 and adjacent fin 16 separated by flow channel 18. This design, however, has several distinct disadvantages. Because edges 24, 26, 28, and 30 of body 12 have a greater surface area exposed to the ambient air than interior portion 32, edges 24, 26, 28, and 30 cool faster by convection than interior portion 32. The result is uneven heat dissipation and cooling of any component affixed to heat sink 10 which can cause warping, cracking and malfunctioning of the component the heat sink is designed to cool.

Figure 2:
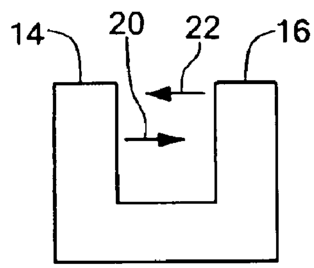
FIG. 2 is an enlarged view of the square channel fins shown in FIG. 1.

Another disadvantage with prior art heat sink 10 is that heat from each fin is projected toward all adjacent fins. As shown in FIG. 2, heat radiating from upstanding fin 14, shown as arrow 20, is projected toward adjacent fin 16. Similarly, heat radiating from fin 16 is projected toward upstanding fin 14 as shown by arrow 22. The cross-flow of heated air projected toward adjacent fins heats the fins 14 and 16 thereby reducing the cooling efficiency of heat sink 10.

Figure 3:
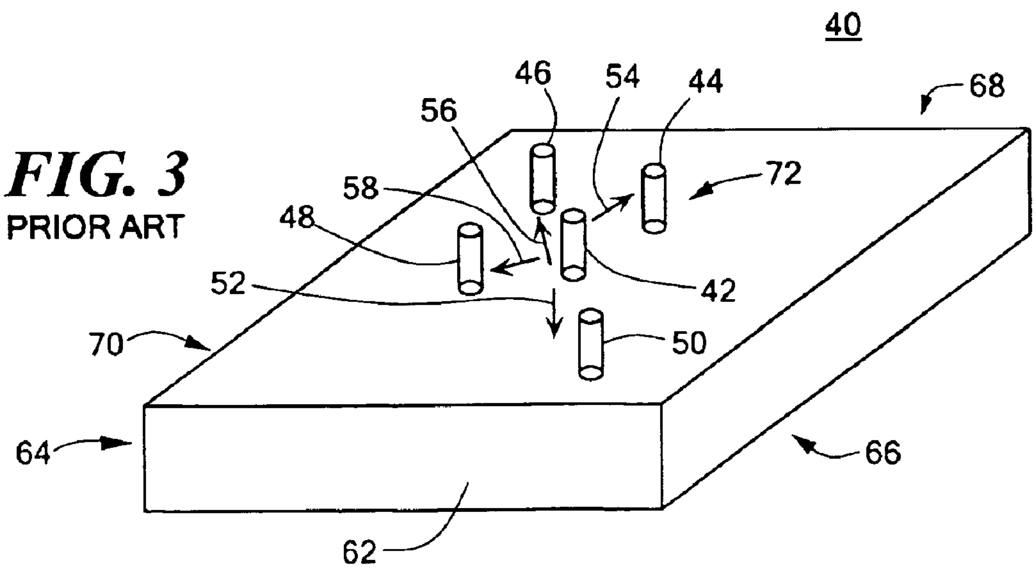
FIG. 3 is a schematic three-dimensional view showing a prior art heat sink with cylindrical pin-fins.

Other prior art heat sinks employ cylindrical pin-fins to increase the total surface area of the heat sink to increase heat transfer by convection. Pin-fin heat sink 40, FIG. 3, includes cylindrical pin fins 42, 44, 46, 48 and 50. Although this design increases the overall surface area of heat sink 40, it suffers from the same design flaw as square channel fins. The multiple pin projections create airflow resistance and increase airflow turbulence reducing airflow velocity and cooling ability. As shown in FIG. 3, heat radiates from fin 42 toward adjacent fins 44, 46, 48 and 50 in directions 52, 54, 56 and 58 thereby reducing the cooling efficiency and overall performance of heat sink 40.

Another problem with prior art heat sink 10, FIG. 1 is that the flat square surfaces of channel 18 and edges 24, 26, 28 and 30 block the air flow thereby increasing air flow resistance and turbulence resulting in reduced air flow velocity and flow-through characteristics which reduces the convective efficiency of heat sink 10. Further, the flat square design of heat sink 10 is not aerodynamically efficient.

Still another problem with prior art heat sink 10, FIG. 1 is that the net contribution to the total surface area at various locations 13, 15, 17, and 19 of uniform length body 12 is the same. As discussed in the Background of the Invention section above, heat transfer by conduction is shown by the relationship:

$$q_L = kA\frac{\Delta T}{L} \tag{2}$$

where k is the thermal conductivity of the material, A is the cross-sectional area perpendicular to the heat transfer direction, ΔT is the temperature difference between the two mediums, and L is thickness of the material in the main direction of the heat flow. Because the cross-section area and thickness of body 12 is the same at locations 13, 15, 17, and 19, the same amount of conductive cooling occurs at locations 13 and 17 as at location 15 and 19. Because of the increased convective cooling at edges 24, 26, 28, and 30 due to the greater surface area exposed to ambient air, heat sink 10 cools unevenly, with greater cooling at edges 24, 26, 28, and 30 than at interior location 32.

Pin-fin heat sink 40, FIG. 3, also includes uniform thickness body 62 with a constant cross-sectional area and suffers from the same design problem as heat sink 10 as noted above. Because the surface edges 64, 66, 68 and 70 cool faster than the interior portion 72, non-uniform cooling and heat dissipation results for any component attached to heat sink 40.

Figure 4:
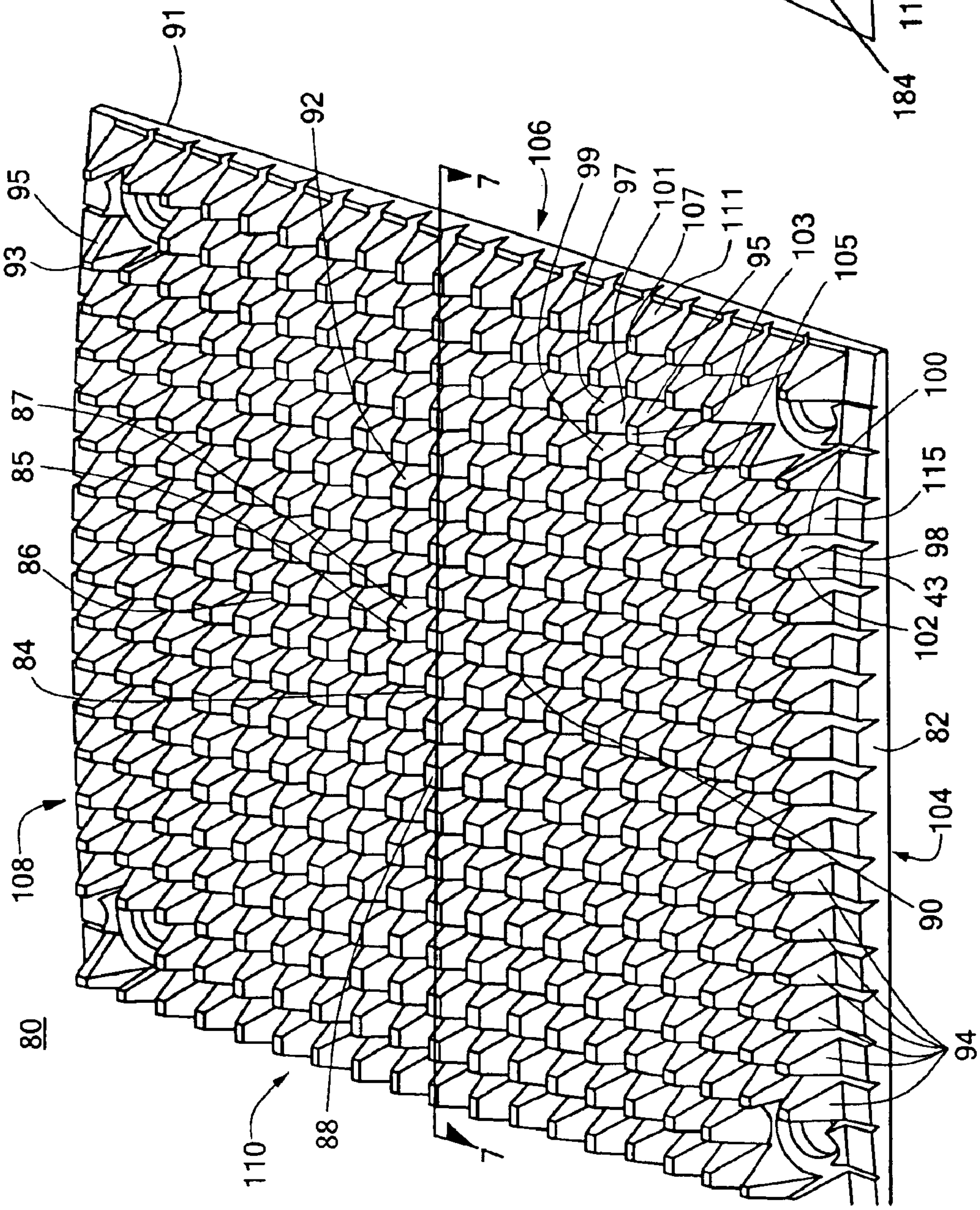
FIG. 4 is a schematic three-dimensional top view of one embodiment of the uniform heat dissipating and cooling heat sink of the subject invention.

In sharp contrast, uniform heat dissipating and cooling heat sink 80, FIG. 4 of the subject invention includes base 82 with a maximum thickness at interior portion 84 to increase conductive cooling at locations where conductive cooling and the temperature differential is reduced, such as locations 84, 86, 88, 90 and 92. Heat sink 80 also includes a plurality of fins 94 upstanding from base 82. Adjacent fins, for example fins 113 and 115, FIG. 4 are separated by flow channel 98 therebetween having diverging sides 100 and 102. Unique flow channel 98 with diverging sides 100 and 102, is shown in greater detail in FIGS. 5 and 6.

In one preferred embodiment, base 82 of heat sink 80, FIG. 4, is rectangular with a maximum thickness at center 84, and the thinnest portions at edges 104, 106, 108, and 110. Typically heat sink 80 is 2.5" wide by 2.5" long and made of aluminum or a similar conductive metal or alloy. Fabrication methods include die-casting, molding, machining, or similar methods.

Figure 6:
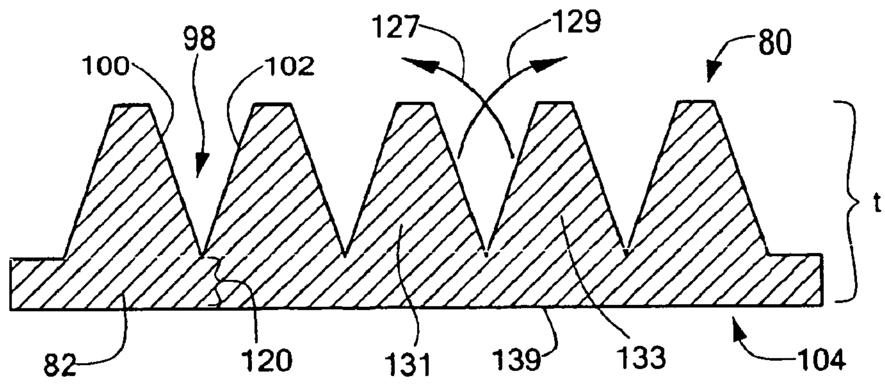
FIG. 6 is a schematic side view of the heat sink shown in FIG. 4.
Figure 7:
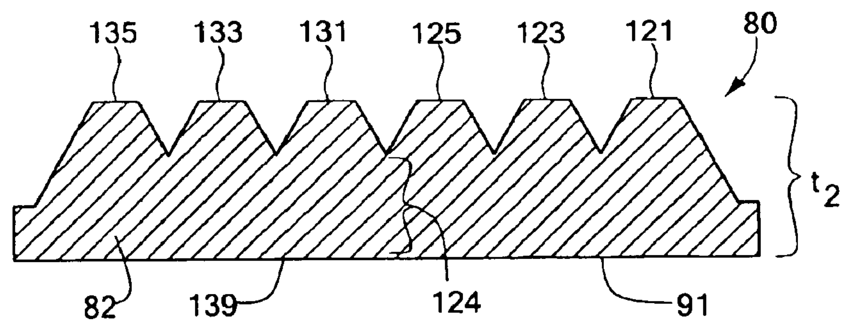
FIG. 7 is a schematic cross-sectional view of the heat sink shown in FIG. 4 taken along line 7—7.

Preferably, in this invention, the thickness from the bottom of the flow channel to the bottom surface of the base is twice as much at the center than at the edges. For example, as shown in FIG. 6, base 82 of heat sink 80 has a minimum thickness 120 between the bottom of flow channel 98 and bottom surface 139. As center 84 of heat sink 80 is approached the distance between the bottom of the flow channel 98 and bottom surface 139 steadily increases. As shown in FIG. 7, taken along centerline 7—7 of FIG. 4, the maximum thickness 124 between the bottom of flow channel 98 and bottom surface 139 is reached at center 84. Preferably, maximum thickness 124 is twice minimum thickness 120. As a result, the cross-sectional area perpendicular to the heat transfer direction is achieved at center 84, FIG. 4 and provides more cooling at interior locations 84, 86, 88, 90 and 92 than at the edges 104, 106, 108, and 110 in accordance with equation (2) above.

Heat sink 80, FIG. 4 also preferably includes flow channels separating adjacent fins and wherein the flow channels have diverging sides to form a plurality of discrete pyramid shaped fins. For example, fins 95, 97 and 99 are each separated by flow channels 101, 103 and 105 with diverging sides to form pyramid shaped fins, as exemplified by fins 95, 97, and 99. Each fin has a rectangular base, a rectangular cross section 111, and flat rectangular top 107 to maximize the surface area of the fins. The unique pyramid design shape of fins 95 and 97 shown in greater detail in FIG. 5.

Ideally, flow channel 98 is in the form of a V-shaped groove, as shown in FIGS. 4–7, but the channel may also be U-shaped, or other similar shape. Diverging sides 100 and 102 of flow channel 98 are preferably at an angle of between 20° and 30°.

In one embodiment of the subject invention, the fins all have the same height. As shown in FIG. 4, flat rectangular surface area 93 of fin 95 located near edge 108 is at the same height relative to bottom surface 91 as flat rectangular surface area 85 of fin 87 located near center 84. Shown in greater detail in FIG. 7, top surface areas 121, 123, 125, 131 and 135 are at uniform distance 122 from bottom surface 91. Because the thickness from the bottom of each flow channel to the bottom of the base may be twice as much at the center than at the edges, the fins near the center 84 are shorter and wider than fins at edges 104, 106, 108, and 110. Accordingly, flat rectangular surface area 85 of pin 85, FIG. 4, near center 84 has a greater surface area than flat rectangular surface area 93 of pin 95 located near edge 108. The result is greater convective cooling in interior regions 86, 88, 90 and 92 than at edges 104, 106, 108 and 110 thereby providing efficient uniform cooling and heat dissipation of a component attached to heat sink 80.

Figure 8:
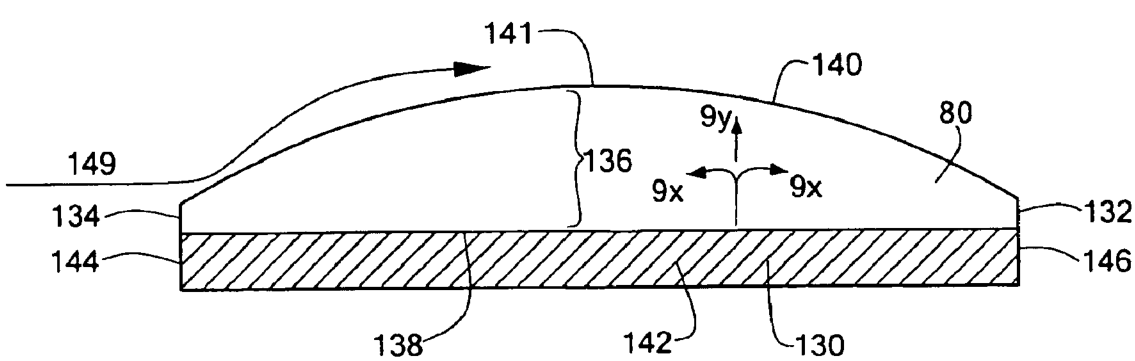
FIG. 8 is a schematic view showing the unique dome-like shape of the heat sink of the subject invention.

Uniform heat dissipating and cooling heat sink 80 has a unique three-dimensional dome shape that provides uniform cooling and heat dissipation. Although heat sink 80 has a 3-dimensional shape and heat conduction is three dimensional, inferences can be drawn from the simple principle of one dimensional heat flow. For example, heat flow can best be illustrated in the ideal situation in which heat sink 80, FIG. 8 is attached to component 130 which is generating heat as shown in FIG. 8. Component 130 is insulated on all surfaces except surface 138 which is between heat sink 80 and component 130. Top surface 140 of heat sink 80 is maintained at a constant ambient air temperature which is lower than the temperature of heated component 130. If all the surfaces of heat sink 80 are maintained at constant ambient temperature and the thickness of heat sink 80 near edges 132 and 134 is less than center thickness 136 (i.e. the cross-sectional area of heat sink 80 increases toward center 141) there will be greater contributions to the net heat flux as center 141 of the heat sink 80 is approached by virtue of equation (2) above. Thus, for heated component 130 there will more heat loss at center 142 than at edges 144 and 146. The result is uniform overall cooling and heat dissipation of electronic component 130. The efficient, uniform cooling and heat dissipation which occurs by virtue of heat sink 80 prevents warping, cracking and damage to electronic component 130.

Further, the unique dome shape of heat sink 80, FIG. 8, produces an airfoil like shape which increase air flow velocity, as shown by arrow 149, to further increase the convective cooling efficiency of heat sink 80.

Unique channel 98 with diverging sides 100 and 102, FIG. 6, projects heated air away from adjacent fins. As shown by arrows 127 and 129, heated air radiating from adjacent fins 131 and 133 is directed away from each adjacent fin, thereby preventing adjacent fins 131 and 133 from being heated by the heated air radiating from each fin. This unique feature results in cooler, more efficient fins which increases the cooling efficiency of heat sink 80.

Figure 5:
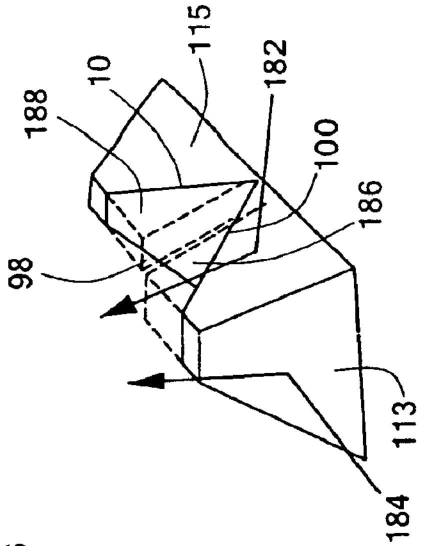
FIG. 5 is an enlarged view showing two adjacent fins of the heat sink shown in FIG. 4.

Unique flow channel 98 with diverging sides 100 and 102 also reduces air flow resistance and air flow turbulence. As shown in FIG. 5, by eliminating surface areas 186 and 188 (shown in phantom) from flow channel 98, the maximum effective flow channel width is achieved. The result is increased flow-though velocity and reduced airflow turbulence. Further, the unique pyramid shape, as exemplified by fin 113, FIG. 5 eliminates any concerns for airflow direction and efficiently deflects air flow. As shown by arrows 182 and 184, the airflow is deflected in the same direction as the incoming airflow, resulting in minimal reduction in airflow velocity and turbulence which increases the convective cooling efficiently of heat sink 80.

In sharp contrast, prior art heat sink 10, FIG. 1 abruptly blocks airflow and deflects the airflow back at the incoming airflow, as shown by arrows 21 and 23. The flat surface design significantly reduces airflow velocity, increases airflow turbulence, and reduces the overall cooling efficiency of prior heat sink 10.

Figure 9:
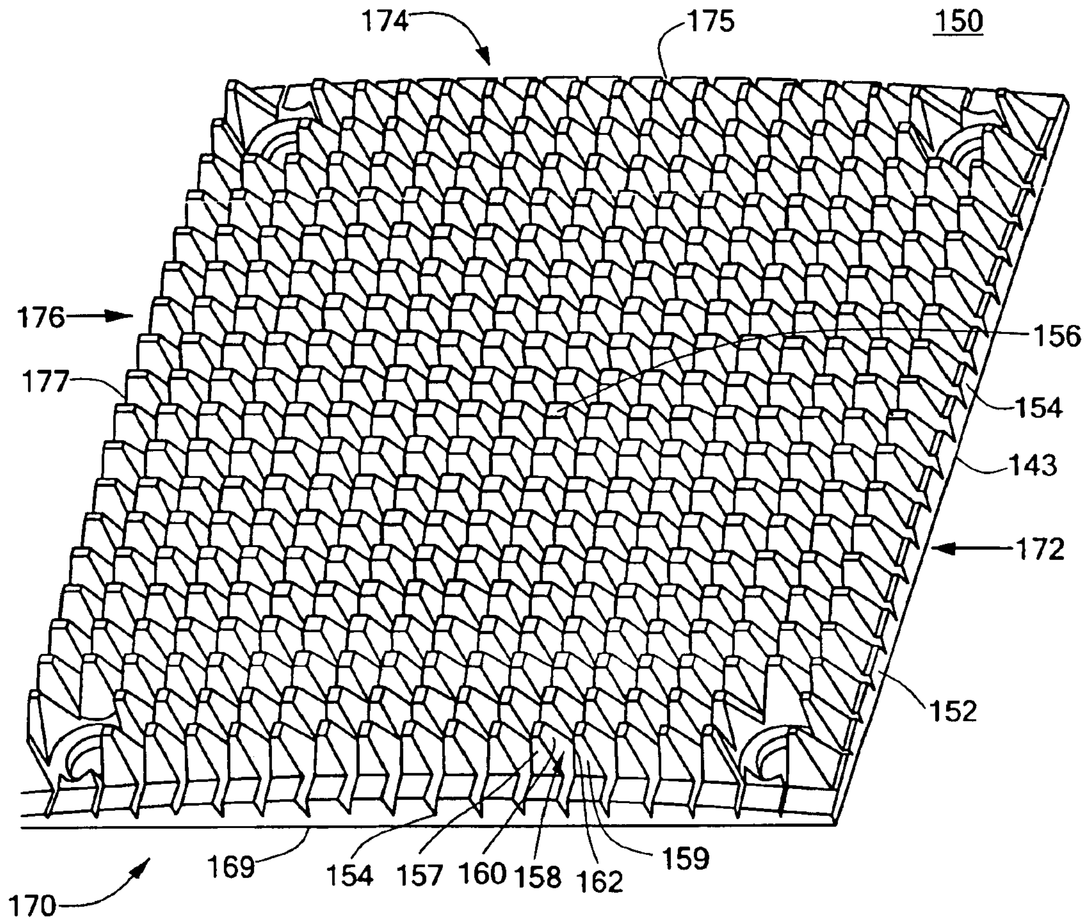
FIG. 9 is a schematic three-dimensional top view of another embodiment of the uniform heat dissipating and cooling heat sink in accordance with the subject invention.

In another embodiment of the subject invention, uniform heat dissipating and cooling heat sink 150, FIG. 9 includes base 152 with a maximum thickness at center location 154 to increase conductive cooling at locations where conductive cooling and the temperature differential is reduced, such as location 156. Adjacent fins 157 and 159 are separated by flow channel 158 having diverging sides 160 and 162. The dome shape of heat sink 150 is created by steadily increasing the thickness from the bottom surface of base 152 to the bottom of the flow channel. For example, the distance between the bottom flow channel 158, FIG. 10 and bottom surface 161 of base 152 is distance 164. Moving towards center location 169, maximum distance 166 between the bottom surface 161 and the bottom of flow channel 168 occurs at center location 169. By steadily increasing the thickness between the bottom of the flow channel and the bottom surface of the base from sides 170, 172, 174 and 176 toward center locations 169, 173, 175 and 177 of edges 170, 172, 174 and 176 respectively, a unique dome shaped heat sink is created.

The unique dome shape of heat sink 150 provides more conductive cooling at center location 156 than at edges 170, 172, 174, and 176. The result is efficient, effective, and uniform cooling and heat dissipation for an electrical or other component attached to heat sink 150.

Figure 11:
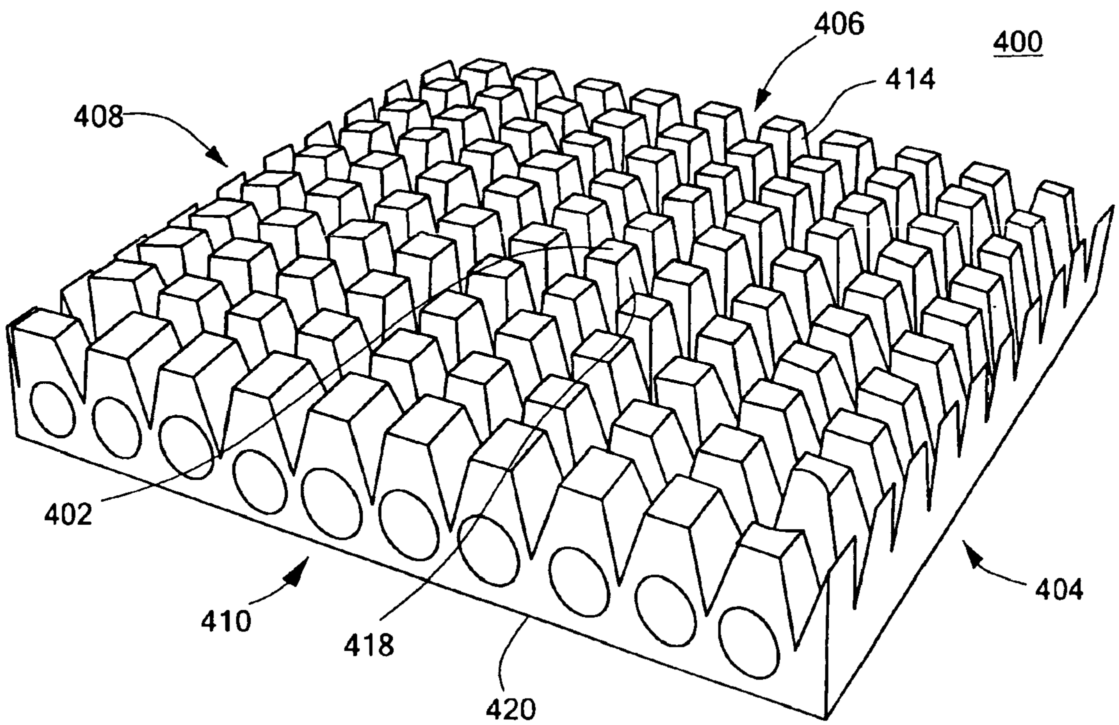
FIG. 11 is a schematic three-dimensional top view of another embodiment of the uniform heat dissipating and cooling heat sink of the subject invention.

In another embodiment of the subject invention, uniform heat dissipating and cooling heat sink 400, FIG. 11, includes fins which project to greater heights at the interior regions than at the edges. For example, fin 418 located at interior region 402 projects higher relative to bottom surface 420 than of pin 414 located at edge 406. Shown in greater detail in FIG. 12, fin 418 projects higher relative to bottom surface 420 than fins 417, 415 and 414 respectively. By steadily increasing the height of the fins from edges 404, 406, 408 and 410 toward center 402, a unique dome shape can be achieved having a maximum cross-sectional area perpendicular to the heat transfer direction at interior region 402. Ideally, the fins at interior region 402 project twice as high as the fins at the edges 404, 406, 408, and 410. The result is uniform conductive cooling and heat dissipation of a component attached to heat sink 400.

Figure 10:
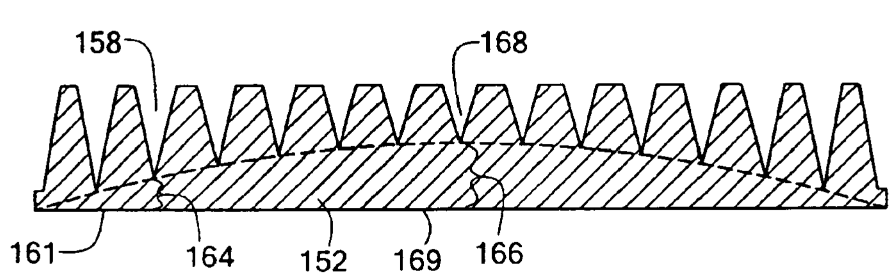
FIG. 10 is a schematic side view of the uniform heat dissipating and cooling heat sink shown in FIG. 9.
Figure 12:
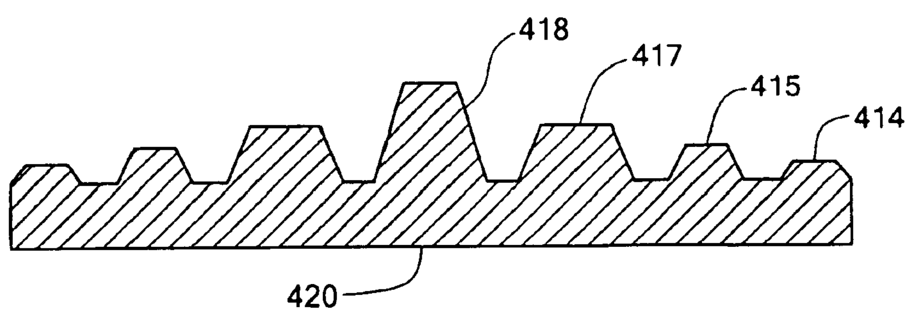
FIG. 12 is a schematic side view of the uniform heat dissipating and cooling heat sink shown in FIG. 11.

Although the distance from the bottom of flow channels to bottom surface may be constant as shown in FIGS. 11 and 12, other designs include varying the thickness from the bottom of each flow channel to the bottom of the base to be greater at the center than at the edges as shown in FIG. 4, or steadily increasing the thickness from the bottom of base to the bottom of the flow channel, as shown in FIGS. 10 and 11.

Figure 13:
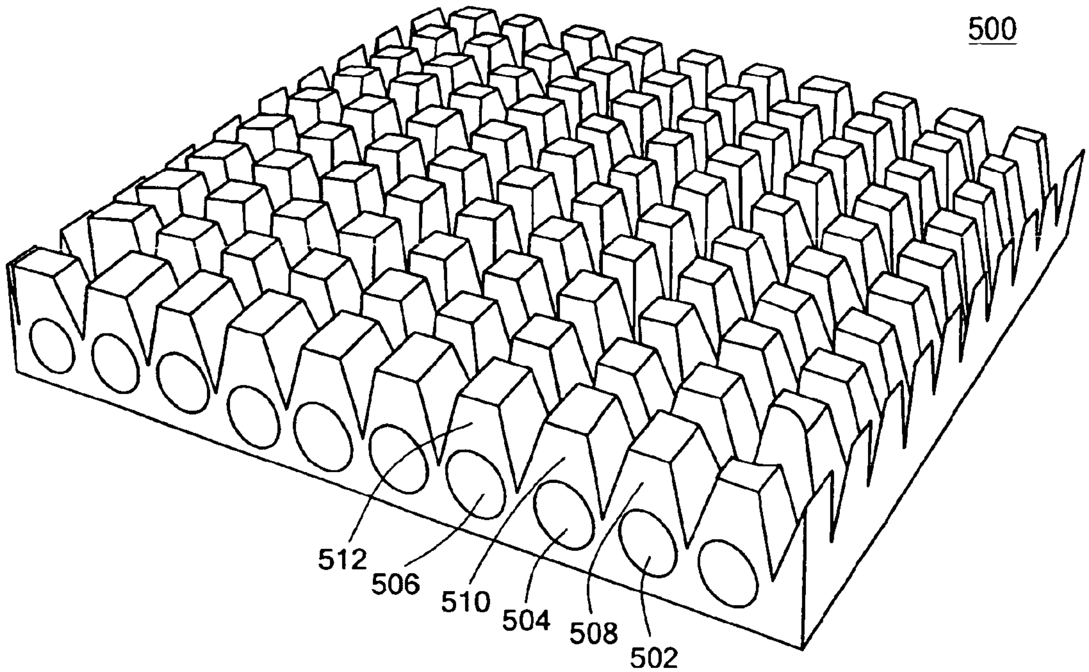
FIG. 13 is a schematic three-dimensional top view of yet another embodiment of the uniform heat dissipating and cooling heat sink of the subject invention.

In yet another embodiment of this invention, uniform heat dissipating and cooling heat sink 500, FIG. 13, includes a plurality of channels 502, 504, and 506 extending therethrough to increase convective cooling. For example, channels 502, 504 and 506 extend though fins 508, 510 and 512 respectively. The result is that the channels 502, 504, and 506 provide increased air flow-through which increases convective cooling. Ideally, all the fins of heat sink 500 include channels extending through each fin, but alternatively only selected fins may include channels depending on the application of the heat sink.

Figure 14:
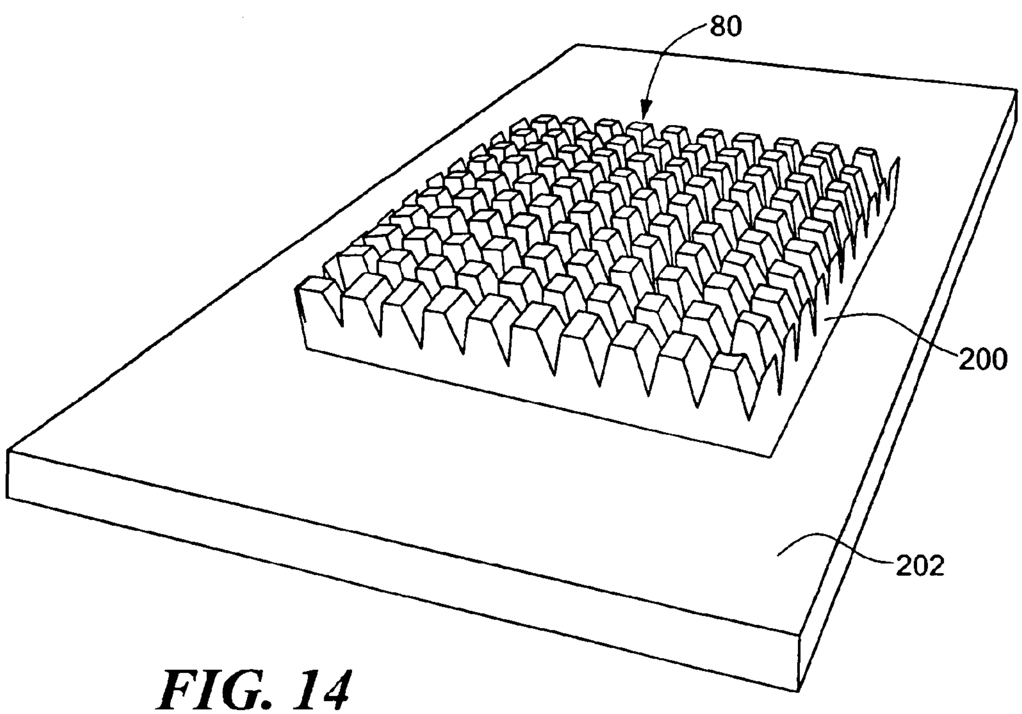
FIG. 14 is a schematic three-dimensional view showing the uniform heat dissipating and cooling heat sink of the subject invention in place on top of an electrical component mounted on a PC board.

In operation, the heat sink in accordance with the subject invention is typically placed on an electrical component mounted in a PC board, telecommunication board or similar electronic circuit board. As shown in FIG. 14, heat sink 80 is attached to electronic component 200 mounted in electronic circuit board 202. Unique flow channels 98, FIG. 4 maximize effective flow channel width for the same fin density. Symmetric fin locations eliminate any concerns for airflow direction. The streamline design produces less frontal obstruction to airflow results in an improvement in air flow-through compared to extruded prior art heat sinks with the same fin density and footprint.

Figure 15:
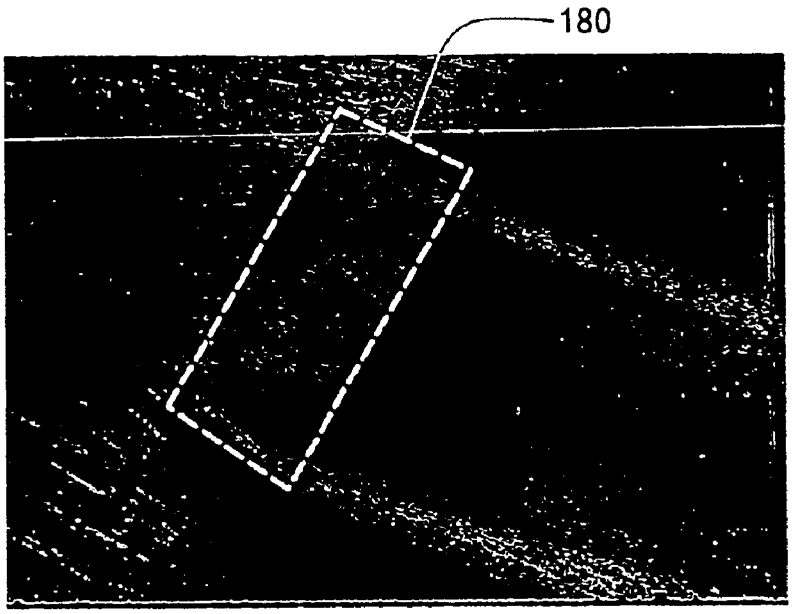
FIG. 15 is a printout from a computer simulation showing the air flow over the heat sink of the subject invention.
Figure 16:
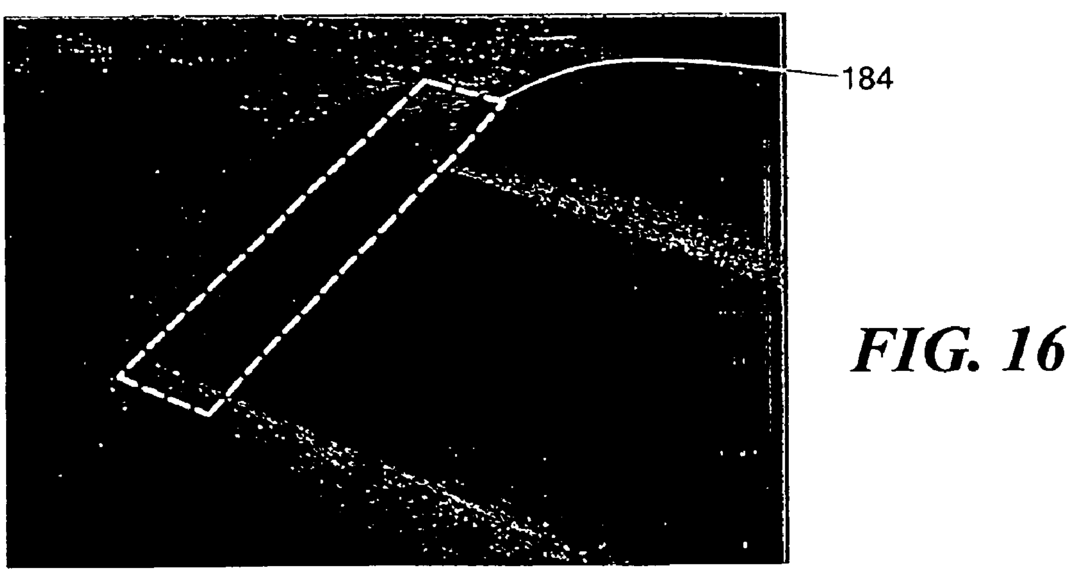
FIG. 16 is a printout from a computer simulation showing the airflow over a prior art heat sink.

The results of a computer simulation comparing the subject invention heat sink and prior art heat sinks is shown in FIGS. 14 and 15. As can be seen from the simulation, the heat sink of the subject invention with reduced frontal obstruction created by the unique pyramid shaped fins resulted in more flow-through over the heat sink, as indicated by area 180, FIG. 15. In sharp contrast, prior art heat sink 10 with flat square fins significantly reduced flow-through over the heat sink as indicated by area 184, FIG. 16.

In another computer simulation involving the cooling of a power supply attached to the heat sink in accordance with the current invention and prior art heat sinks, the subject invention uniform and heat dissipating heat sink reached a maximum temperature of 49° C. In contrast, the prior art heat sinks reached a maximum temperature of 74° C.

Figure 17:
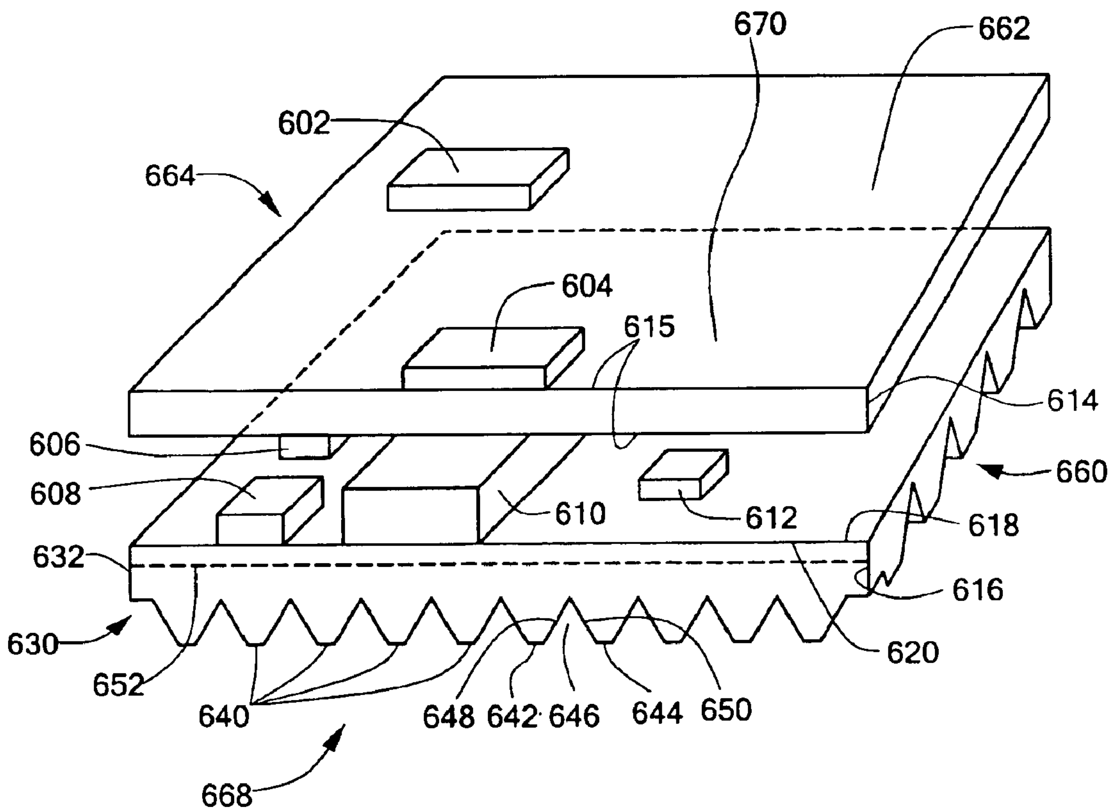
FIG. 17 is a schematic three-dimensional view showing the heat sink of the subject invention integrated as part of an electronic device assembly kit.

In yet another embodiment of the subject invention, the heat sink is integrated as part of an electrical device assembly, such as a power supply. As shown in FIG. 17, electronic device and uniform heat dissipating and cooling sink assembly 600 includes a plurality of electronic components 602, 604, 606, 608, 610, and 612, a first substrate 614 and a second substrate 616. First substrate 614 includes first surface 615 and a second surface 617 and second substrate 616 includes a first surface 618 and a second surface 620. Typically, electronic components 602, 604, and 606 are electrically connected to first substrate 614 on surfaces 615 and 617. However, the unique design of substrate 616 includes first surface 618 for electrically connecting components, such as electronic components 608, 610, and 612, and second surface 616 forming uniform heat dissipating and cooling sink 630. Heat sink 630 is of similar design to heat sinks 80, 150, 400 and 500, FIGS. 4, 9, 11 and 13 respectively, which are applicable to this embodiment. Heat sink 630 includes base 632 with a maximum thickness at interior portion 670 to increase conductive cooling at locations where conductive cooling and the temperature differential is reduced, such as edges 660, 662, 664, and 668. Heat sink 630 also includes a plurality of fins 640 upstanding from base 632. Adjacent fins, for example fins 642 and 644, FIG. 17 are separated by flow channel 646 therebetween having diverging sides 648 and 650. Preferably, base 632 is rectangular with maximum thickness at center 670, and the thinnest portions at edges 660, 662, 664, and 668. Typically substrate 620 which forms heat sink 630 is an aluminum substrate or similar electrically conductive substrate. Fabrication methods may include die casting, molding, machining or similar methods.

Heat sink 630 also include flow channels separating adjacent fins wherein the flow channels have diverging sides to form a plurality of discrete pyramid shaped fins having a rectangular base, a rectangular top, as shown in FIGS. 4, 9, 11 and 13. Ideally flow channel 646, FIG. 17, is a V shaped groove, but the channel may also be U-shaped or other similar shape. Diverging sides 648 and 650 are preferably at an angle between 20° and 30°.

The unique feature of forming heat sink 630 from surface 616 of substrate 610 of electronic assembly 600 eliminates an entire layer of substrate from electronic assembly 600. The result is a reduction in overall thickness of material in the main direction of the heat flow, which in accordance with equation (2) above increases in heat flux and provides more efficient heat dissipation and cooling of electronic assembly 600.

In contrast, prior art electronic device assemblies must include additional substrate layer on which to mount the heat sink. For example, layer 652, FIG. 17, must be provided in prior art heat sinks for attaching an external heat sink. The additional layer increases the thickness of the material in the main direction of heat flow which reduces heat flux thereby reducing the cooling efficiency of an electronic device assembly.

As shown above, the uniform heat dissipating and cooling sink of the subject invention provides efficient and effective uniform cooling and heat dissipation with superior conductive and convection cooling. The unique uniform heat dissipating and cooling sink includes grooved flow channels that allow for maximum flow-channel width while reducing frontal obstruction to airflow. The increased size of the flow channels produce significant improvement in air flow-through and the fins may also include channels extending though each fin to further aid in flow-through. The symmetric pyramid shaped fins eliminates the need to consider airflow direction. The streamline dome shape provides more cooling and heat dissipation in regions where cooling and temperature differential is reduced and also increases airflow velocity. The heat sink can also be directly integrated as one of the substrate layers of an electronic device assembly for increased conductive cooling and heat dissipation.

Although specific features of the invention are shown in some drawings and not in others, this is for convenience only as each feature may be combined with any or all of the other features in accordance with the invention. The words “including”, “comprising”, “having”, and “with” as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A uniform heat dissipating and cooling heat sink comprising:

a base having a top surface in the shape of a dome, a bottom surface, at least one edge, and a center, the base having a variable thickness that is measured between the top surface and the bottom surface-that steadily increases from the edge to the center; and a plurality of fins each having a long dimension and a rectangular cross-section perpendicular to the long direction, said plurality of fins upstanding from the top surface of the base wherein the distance from the tops of the fins to the bottom surface of the base at the center is greater than the distance from the tops of the fins to the bottom surface of the base at the edge, and each fin is separated from each adjacent fin by a V-shaped coaling air flow channel.

2. The heat sink of claim 1, where the base has a perimeter comprising four edges that bound a rectangular shape.

3. The heat sink of claim 1 in which each fin has a rectangular top for increasing the surface area of the fins.

4. A dome-shaped uniform heat dissipating and cooling heat sink comprising:

a base having a top surface, a bottom surface, at least one edge, and a center; and a plurality of fins each having a long dimension and a rectangular cross-section perpendicular to the long direction, said plurality of fins upstanding from the top surface of the base wherein the distance from the tops of the fins to the bottom surface of the base at the center is greater than the distance from the tops of the fins to the bottom surface of the base at the edge, and each fin is separated from each adjacent fin by a V-shaped cooling air flow channel.

* * * * *